United States Patent
Chang

(10) Patent No.: US 9,601,521 B2
(45) Date of Patent: Mar. 21, 2017

(54) LIQUID CRYSTAL DISPLAY

(71) Applicant: Samsung Display Co., Ltd., Yongin, Gyeonggi-Do (KR)

(72) Inventor: Jong Woong Chang, Asan-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/845,576

(22) Filed: Sep. 4, 2015

(65) Prior Publication Data

US 2016/0126260 A1    May 5, 2016

(30) Foreign Application Priority Data

Oct. 30, 2014  (KR) .................. 10-2014-0149349

(51) Int. Cl.
  *H01L 27/14*  (2006.01)
  *H01L 27/12*  (2006.01)
  *G02F 1/1368*  (2006.01)

(52) U.S. Cl.
  CPC .......... *H01L 27/124* (2013.01); *G02F 1/1368* (2013.01)

(58) Field of Classification Search
  CPC .................................. H01L 27/124

USPC .......................................... 257/72
See application file for complete search history.

(56) References Cited

U.S. PATENT DOCUMENTS

| 2011/0242086 A1 | 10/2011 | Kitagawa et al. |
| 2013/0201174 A1 | 8/2013 | Pyun et al. |
| 2013/0300641 A1 | 11/2013 | Kim |

FOREIGN PATENT DOCUMENTS

| JP | 05-48389 A | 2/1993 |
| KR | 10-2008-0062544 A | 7/2008 |
| KR | 10-2013-0098655 A | 9/2013 |

*Primary Examiner* — Anthony Ho
(74) *Attorney, Agent, or Firm* — Robert E. Bushnell, Esq.

(57) ABSTRACT

A liquid crystal display including a plurality of pixels that display an image, each pixel includes a thin film transistor that includes a gate electrode, a source electrode having a bar-shape and partially overlapping the gate electrode, and a drain electrode facing the source electrode at a location corresponding to the gate electrode, the drain electrode includes a first end portion having a C-shape that surrounds a distal end of the bar-shaped source electrode. This design eliminates an overlap between a data line and the gate electrode, which eliminates an overlap between the data line and the channel area of a semiconductor layer, which reduces a parasitic capacitor of the data line, resulting in less current to drive the data line, resulting in reduced power consumption of the display.

20 Claims, 13 Drawing Sheets

LIQUID CRYSTAL DISPLAY

This application claims priority to and the benefit of Korean Patent Application No. 10-2014-0149349 filed in the Korean Intellectual Property Office on Oct. 30, 2014, the entire contents of which are incorporated herein by reference.

BACKGROUND

Field

Embodiments of the present invention relates to a liquid crystal display having a thin film transistor design that reduces a capacitance between a data line and a channel region, thereby improving energy efficiency.

Description of the Related Art

A liquid crystal display, which is a light receiving element which does not emit light by oneself, is generally constituted by a liquid crystal panel displaying a screen and a backlight device supplying light to the liquid crystal panel. The backlight device includes a light source emitting light. Examples of the light source include a cold cathode fluorescent lamp (CCFL), an external electrode fluorescent lamp (EEFL), and the like, and a light emitting diode (LED) is recently used instead of the lamp as the light source. Since the light emitting diode does not use mercury unlike the CCFL, it is environmentally-friendly, and has color reproduction of 104% in comparison with National Television System Committee (NTSC), which results in a representation of a color closer to nature.

Meanwhile, various methods for decreasing power consumption of the liquid crystal device have been developed. One of the factors that increase the power consumption of the liquid crystal display is capacitance generated by an overlap between a data line and a thin film transistor (TFT) channel. As the overlap between the data line and the TFT channel is increased, the capacitance is increased. Consequently, since a current magnitude of a data signal applied to the data line needs to be further increased, the power consumption of the liquid crystal device is increased.

The above information disclosed in this Background section is only for enhancement of understanding of the background of the invention and therefore it may contain information that does not form the prior art that is already known in this country to a person of ordinary skill in the art as per 35 U.S.C. §102.

SUMMARY

The present invention has been made in an effort to provide a liquid crystal display having advantages capable of decreasing power consumption by improving an overlap between a data line and a thin film transistor (TFT) channel.

According to one aspect of the present invention, there is provided a liquid crystal display including a plurality of pixels to display an image, wherein each pixel includes a thin film transistor that includes a gate electrode, a source electrode partially overlapping the gate electrode, the source electrode may have a bar-shape and a drain electrode facing the source electrode at a location corresponding to the gate electrode, wherein the drain electrode includes a first end portion having a C-shape that surrounds a distal end portion of the bar-shaped source electrode.

The drain electrode may also include a second and opposite end portion having a large area. The drain electrode may also include a neck portion interposed between and connecting together the first end portion and the second end portion. The gate electrode may have a width that is covered by and extends from the neck portion of the drain electrode to a middle portion of the source electrode. The gate electrode may have a height that is entirely covered by the first end portion of the drain electrode. The gate electrode and the source electrode may overlap each other, while the gate electrode is not overlapped by a data line.

The liquid crystal display may also include a gate insulating layer arranged on a gate line, a semiconductor layer arranged on the gate insulating layer and a data conductor, including the data line and the drain electrode, arranged on the semiconductor layer. The liquid crystal display may also include a plurality of ohmic contacts arranged between the semiconductor layer and the data conductor.

According to another aspect of the present invention, there is provided a liquid crystal display including a plurality of pixels to display an image, wherein each pixel includes a thin film transistor that includes a gate electrode, a source electrode partially overlapping the gate electrode, the source electrode having a bar-shape and a drain electrode facing the source electrode at a location corresponding to the gate electrode, the drain electrode may include a first end portion selected from a bar shape that extends parallel to the source electrode and an L-shape having two sides facing a distal end of the bar-shaped source electrode. The drain electrode may also include a second and opposite end portion having a large area. When the first end portion has the L-shape, the first end portion and the second end portion may be connected together by a connecting portion having a bar-shape therebetween. When the first end portion of the drain electrode has the bar-shape, a long side of the drain electrode and a long side of the source electrode face each other. The source electrode may overlap the gate electrode while the gate electrode may not be overlapped by a data line.

According to yet another aspect of the present invention, there is provided a liquid crystal display including a plurality of pixels displaying an image, each of the pixels includes a thin film transistor that includes a gate electrode, a source electrode partially overlapping the gate electrode, the source electrode includes a first end portion having an I-shape and a connecting portion having a bar-shape connecting a data line to the first end portion and a drain electrode facing the source electrode at a location corresponding to the gate electrode, the drain electrode may include a first end portion having an I-shape that faces the source electrode.

The first end portion of the drain electrode may face the first end portion of the source electrode. The drain electrode may also include a second and opposite end portion having a large area. The drain electrode may also include a connecting portion having a bar-shape connecting the second end portion to the first end portion. The gate electrode may have a width covering and extending from the connecting portion of the drain electrode to the connecting portion of the source electrode. An entirety of the first end portion of the drain electrode may correspond to and cover the gate electrode. The source electrode may overlap the gate electrode, and the data line may not overlap the gate electrode.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION

Figure 1A:
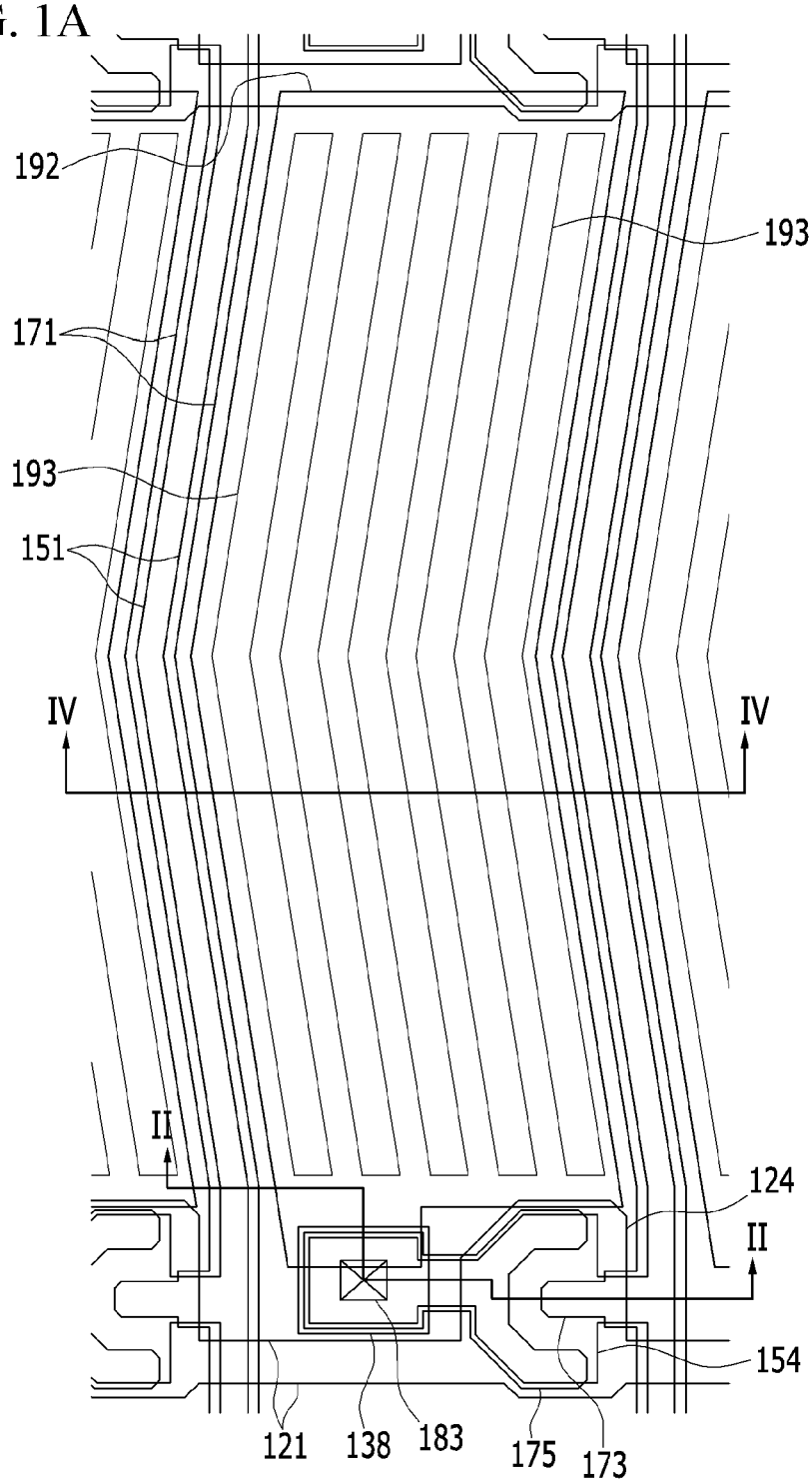
FIG. 1A is a layout view illustrating a liquid crystal display according to a first exemplary embodiment of the present invention.

Hereinafter, exemplary embodiments of the present invention will be described in detail with reference to the accompanying drawings so that those skilled in the art may easily practice the present invention. The present invention may be implemented in various different forms and is not limited to the exemplary embodiments described in the present specification.

In several exemplary embodiments, components having the same configuration will be described representatively in a first exemplary embodiment by the same reference numerals. In exemplary embodiments other than the first exemplary embodiment, only configurations different from those of the first exemplary embodiment will be described.

Accordingly, the drawings and description are to be regarded as illustrative in nature and not restrictive. Like reference numerals designate like elements throughout the specification Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising", will be understood to imply the inclusion of stated elements but not the exclusion of any other elements. In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, a liquid crystal display according to an exemplary embodiment of the present invention will be described in detail with reference to FIGS. 1 to 3.

Figure 1B:
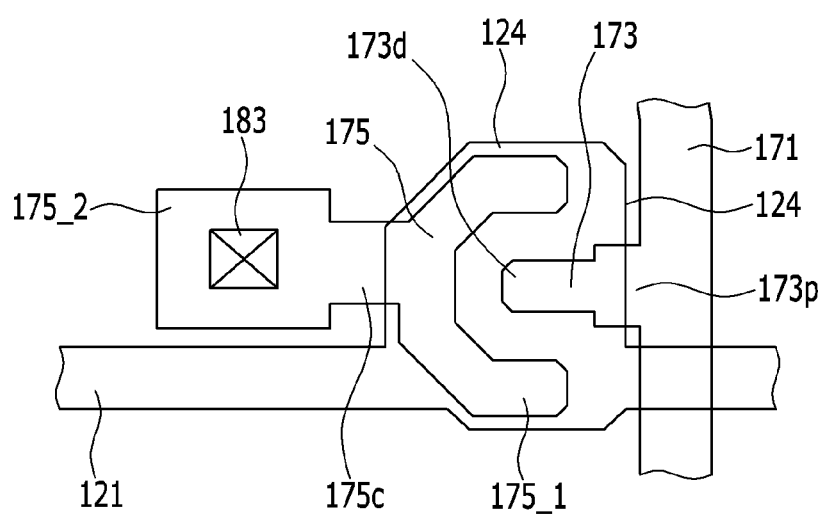
FIG. 1B is a blow up layout view of a thin film transistor portion at the bottom portion of FIG. 1A illustrating in detail the gate, source and drain electrodes and gate and data lines, but absent the semiconductor layer, pixel electrode.
Figure 2:
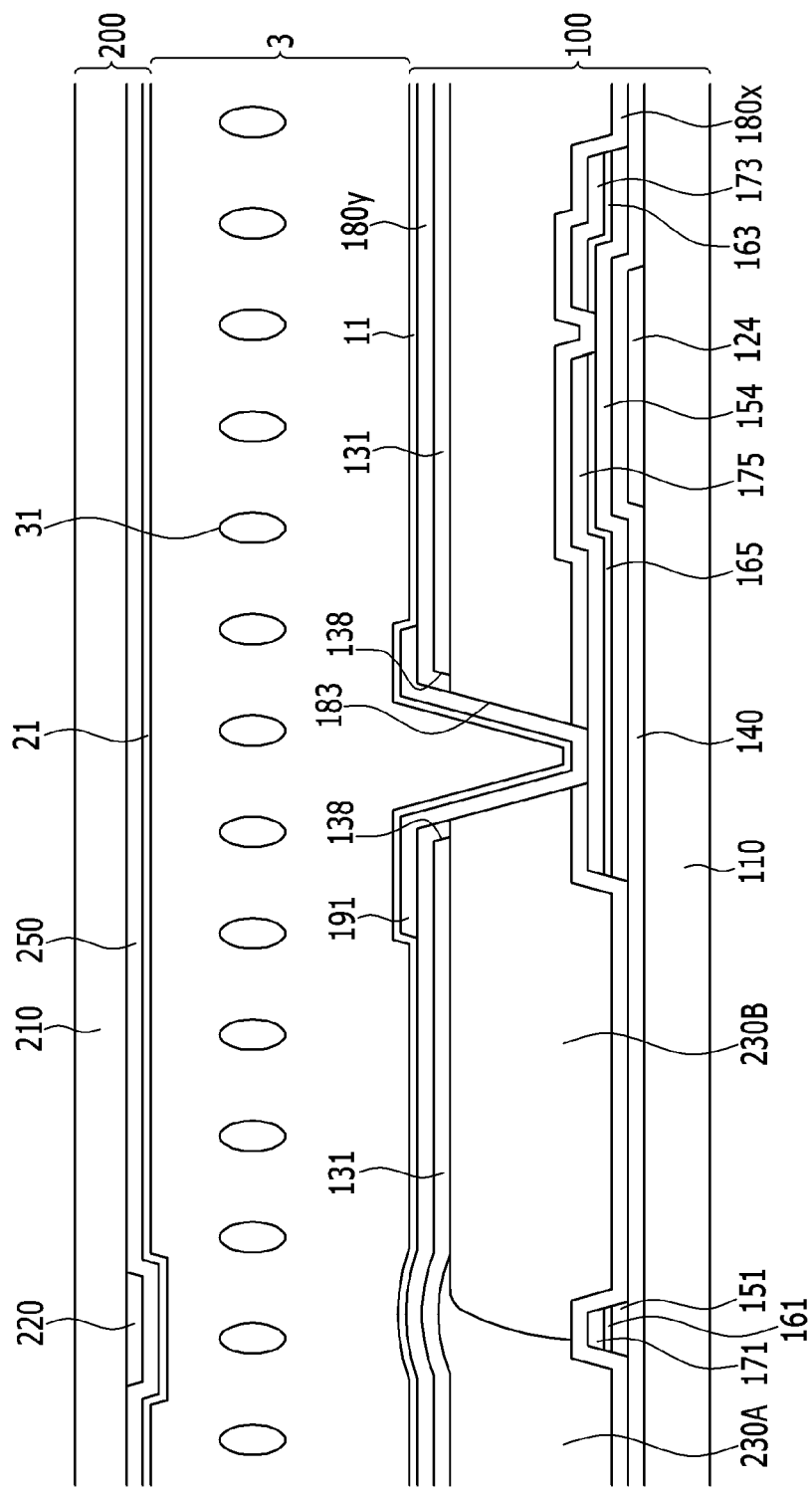
FIG. 2 is a cross-sectional view taken along line II-II of FIG. 1A.
Figure 3:
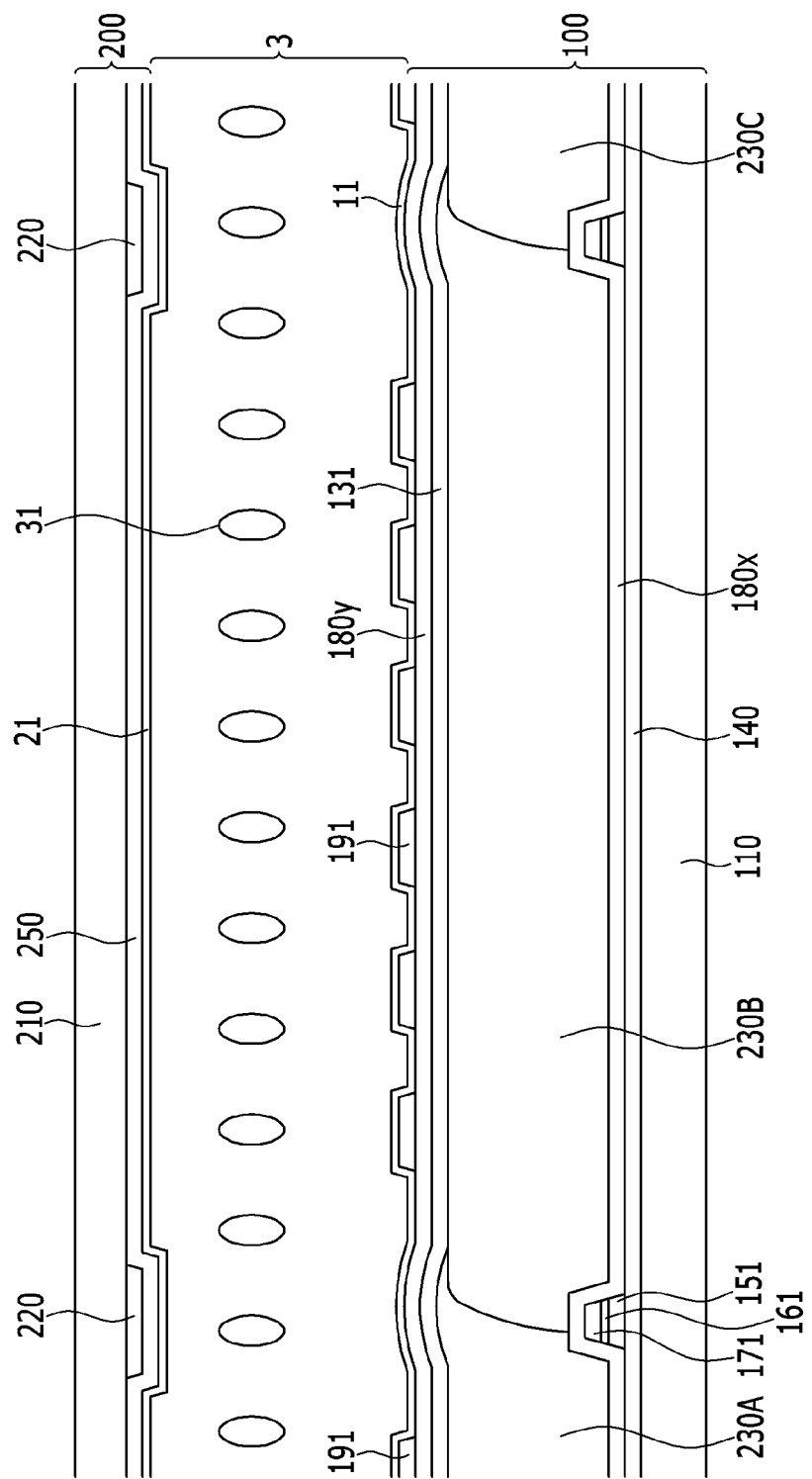
FIG. 3 is a cross-sectional view taken along line III-III of FIG. 1A.

Turning now to FIGS. 1A to 3, FIG. 1A is a layout view illustrating a liquid crystal display according to a first exemplary embodiment of the present invention, FIG. 1B is a blowup detailed version of the thin film portion of FIG. 1A, FIG. 2 is a cross-sectional view taken along line II-II of FIG. 1A and FIG. 3 is a cross-sectional view taken along line III-III of FIG. 1A. FIGS. 1A to 3 illustrate any one of a plurality of pixels included in the liquid crystal display including the plurality of pixels.

Referring now to FIGS. 1A to 3, the liquid crystal display includes a lower display panel 100 and an upper display panel 200 which face each other, and a liquid crystal layer 3 positioned between the two display panels 100 and 200. First, the lower display panel 100 will be described.

A plurality of gate lines 121 are formed on an insulation substrate 110. The gate lines 121 mainly transfer gate signals and is extended in a lateral direction. Each gate line 121 includes a plurality of gate electrodes 124. A gate insulating layer 140 is formed on the gate line 121 and may be made of an inorganic insulating material such as silicon nitride (SiNx) or silicon oxide (SiOx).

A plurality of semiconductor layers 151 are formed on the gate insulating layer 140. The semiconductor layers 151 include a protrusion 154 that extends along the gate electrode 124. Alternatively, the semiconductor 151 may be disposed only on the gate electrode 124.

A plurality of ohmic contacts 161, 163, and 165 are formed on the semiconductor layer 151. The ohmic contacts 163 and 165 face each other in a vicinity of the gate electrode 124, and are disposed in pair on the protrusion 154 of the semiconductor. The ohmic contacts 161, 163, and 165 may be made of a material such as n+ hydrogenated amorphous silicon which is doped with n-type impurities such as phosphorus (P) at a high concentration, or may instead be made of silicide, however the ohmic contacts 161, 163, and 165 may also be omitted.

A data conductor, which includes a plurality of data lines 171 and a plurality of drain electrodes 175, is formed on the ohmic contacts 161, 163, and 165. The plurality of data lines 171 transfer data signals, and mainly extends in a longitudinal (up and down) direction that intersects the plurality of gate lines 121. Each data line 171 includes a source electrode 173 that extends to the gate electrode 124. The source electrode 173 has a bar shape having a distal end portion 173d at a location that overlaps the gate electrode, and a proximal end portion 173p that attaches to the data line 171.

Consequently, the source electrode 173 overlaps the gate electrode 124, but the data line 171 does not overlap the gate electrode 124.

Each data line 171 may be periodically bent to make an oblique angle with an extension direction of each gate line 121. The oblique angle that each data line 171 makes with the extension direction of each gate line 121 may be 45° or more, however, each data line 171 may instead be extended in a straight line.

The drain electrode 175 includes a first end portion 175_1 having a C shape or U shape that faces the source electrode 173 at a location corresponding to the gate electrode 124. The drain electrode 175 also includes a second and opposite end portion 175_2 having a large area. The first end portion 175_1 of the drain electrode 175 having the C shape may surround the distal end portion 173d of the source electrode 173 having the bar shape. The drain electrode 175 may also include a connecting portion 175c having a neck shape connecting the first end portion 175_1 to the second end portion 175_2.

The gate electrode 124 may be formed to have a size, shape and location such that a width thereof extends from (and is thus overlapped by) the connecting portion 175c of the drain electrode 175 to a middle portion of the source electrode 173, and a height thereof being covered by an entirety of the first end portion 175_1 of the drain electrode 175 that has the C shape.

The gate electrode 124, the source electrode 173, and the drain electrode 175 constitute a thin film transistor (TFT), which is a switching element, together with the protrusion 154 of the semiconductor layer 151. Each thin film transistor is connected to the gate line 121 and the data line 171. The protrusion 154 of the semiconductor becomes a channel of the thin film transistor. The semiconductor layer 151 may have a plane shape which is almost identical to that of the data line 171, the drain electrode 175, and the ohmic contacts 161 and 165 below the data line 171 and the source electrode 173, respectively, except for the protrusion portion 154 of the semiconductor layer 151 on which the thin film transistor is arranged.

A first passivation layer 180x is disposed on the data conductors 171 and 175 and on the exposed protrusion 154 of the semiconductor, wherein the first passivation layer 180x may be made of an organic insulating material, an inorganic insulating material, or the like.

A plurality of color filters 230A, 230B, and 230C are formed on the first passivation layer 180x. Each of the color filters 230A, 230B, and 230C may uniquely display one of primary colors, wherein examples of the basic color may include the three primary colors such as red, green, and blue, or yellow, cyan, magenta, and the like. Although not illustrated, the color filter may further include a color filter displaying a mixed color of the primary colors or white, in addition to the primary colors. The color filters 230A, 230B, and 230C may be made of an organic material. Each of the color filters 230A, 230B, and 230C may be elongated along the data line 171, and the two neighboring color filters 230A and 230B, and 230B and 230C bounded by the data line 171 may overlap each other A plurality of common electrodes 131 are formed on the color filters 230A, 230B, and 230C. The common electrode 131 may be made of a transparent conductive material such as an ITO, an IZO, or the like. The common electrode 131, which are a surface-type, may be formed on a front surface of the substrate 110 as a tub plate and may have an opening portion 138 disposed in a region corresponding to the drain electrode 175.

A second passivation layer 180y is disposed on the common electrode 131. The second passivation layer 180y may be made of an organic insulating material, an inorganic insulating material, or the like.

A pixel electrode 191 is formed on the second passivation layer 180y. The pixel electrode 191 includes a plurality of branch portions 193 that substantially extend in parallel to each other while being spaced apart from each other, and upper and lower transverse portions 192 connecting top and bottom end portions of the branch electrode 193 to each other. The branch electrodes 193 of the pixel electrode 191 may be bent similarly to that of the data line 171. Alternately, the data line 171 and the branch electrode 193 of the pixel electrode 191 may instead be extended in a straight line. The pixel electrode 191 may be made of a transparent conductive material such as an ITO, an IZO, or the like. Although the present specification describes a case in which the pixel electrode 191 includes the plurality of branch portions 193 and the transverse portions 192, the pixel electrode 191 may have variously modified shapes.

The first passivation layer 180x, the color filter 230B, and the second passivation layer 180y are provided with a plurality of contact holes 183 exposing a portion of the drain electrode 175, and the pixel electrode 191 is electrically connected to the drain electrode 175 through the contact holes 183 to receive a data voltage. The contact hole 183 is formed at a position corresponding to the opening portion 138 formed in the common electrode 131. The pixel electrode 191 receives data signals that generate an electric field in the liquid crystal layer 3 together with the common electrode 131 that is applied with a common voltage. The common electrode 131 is of a surface type and overlaps the branch portions 193 of the pixel electrode 191. A first alignment layer 11 is then coated on an inner surface of the lower display panel 100.

Now, the upper display panel 200 will be described. The upper display panel 200 includes an insulating substrate 210, a light-shielding member 220 formed on the insulating substrate 210, and a cover layer 250 formed on the light-shielding member 220. The light-shielding member 220 may have a width that is wider than that of the data line 171. A second alignment layer 21 is then coated on the cover layer 250.

The first alignment layer 11 and the second alignment layer 21 may be vertical alignment layers for vertically aligning liquid crystal molecules 31 that are arranged within the liquid crystal layer 3.

The liquid crystal layer 3 interposed between the lower display panel 100 and the upper display panel 200, and may include the liquid crystal molecules 31, wherein the liquid crystal molecules 31 may be aligned so that long sides thereof are perpendicular to surfaces of the lower and upper display panels 100 and 200 when an electric field is not present.

The liquid crystal layer 3 may have positive dielectric constant anisotropy and may have negative dielectric constant anisotropy. The liquid crystal molecules of the liquid crystal layer 3 may be aligned to have a pretilt in a predetermined direction, wherein the above-mentioned pretilt direction of the liquid crystal molecules 31 may be changed depending on the dielectric constant anisotropy of the liquid crystal layer 3.

A backlight part (not illustrated) generating and providing light to the two display panels 100 and 200 may be further provided at an outer portion of the substrate 110 of the lower display panel 100.

The pixel electrode 191, applied with the data signal, generates the electric field in the liquid crystal layer 3 together with the common electrode 131 applied with the common voltage, thereby determining the orientation direction of the liquid crystal molecules 31 of the liquid crystal layer 3 to display a corresponding image.

As described above, by forming the source electrode 173 to extend from the data line 171 to the gate electrode 124 in the bar shape, and by forming the drain electrode 175 having an first end portion 175_1 having the C shape, the gate electrode 124 may be overlapped by the source electrode 173, but the gate electrode 124 is not overlapped by the data line 171. As a result, a portion in which the data line 171 and the gate line 121 overlap each other may be minimized, resulting in the overlap between the data line 171 and the TFT channel being reduced, such that a current magnitude of the data signal applied to the data line 171 can be decreased, thereby making it possible to decrease power consumption of the liquid crystal display.

A liquid crystal display according to Comparative Example to compare with the liquid crystal display according to the first exemplary embodiment of the present invention will now be described with reference to FIGS. 4A and 4B. Compared to FIG. 1, differences will be mainly emphasized.

Figure 4A:
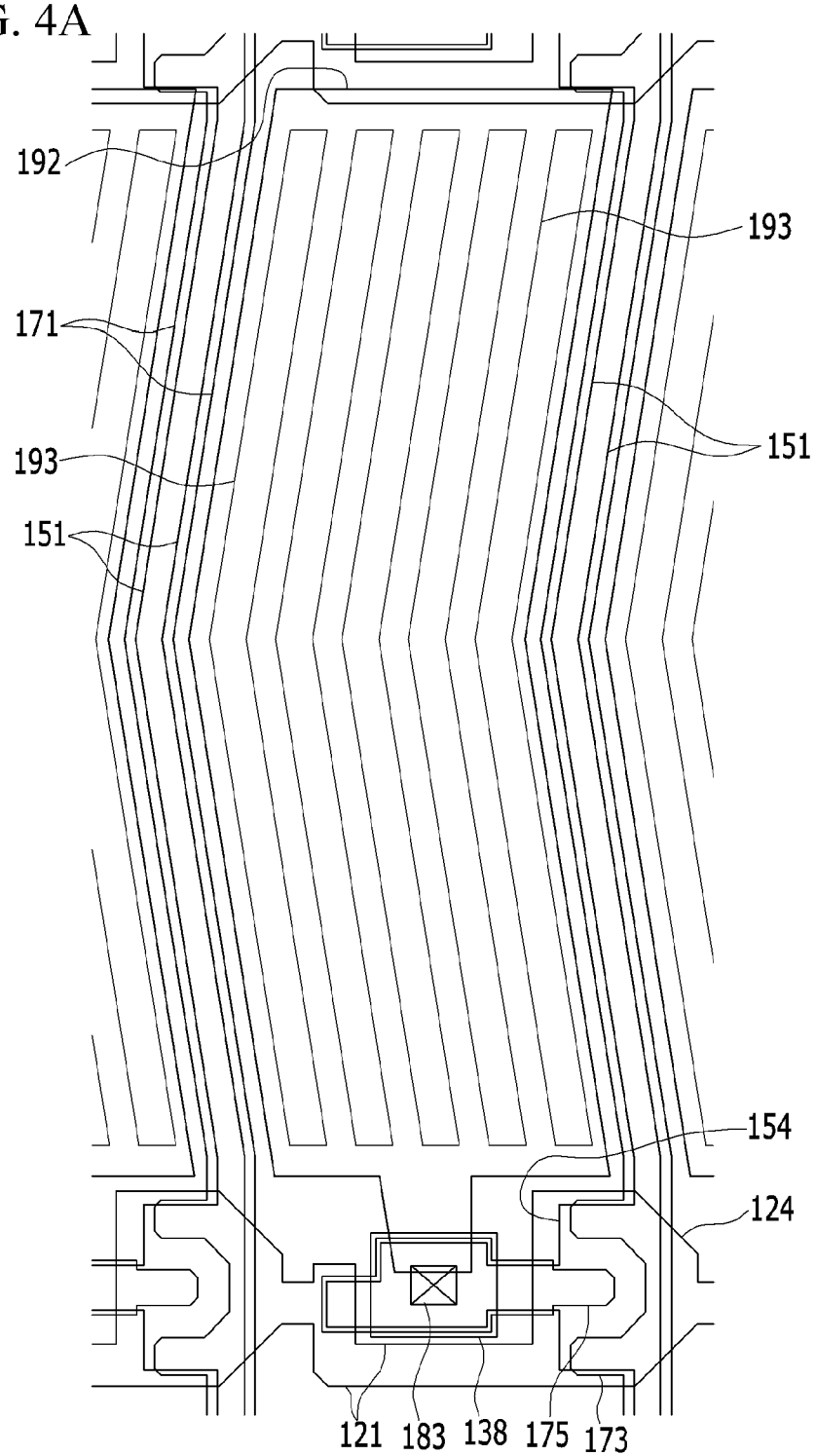
FIG. 4A is a layout view illustrating a liquid crystal display according to a Comparative Example.
Figure 4B:
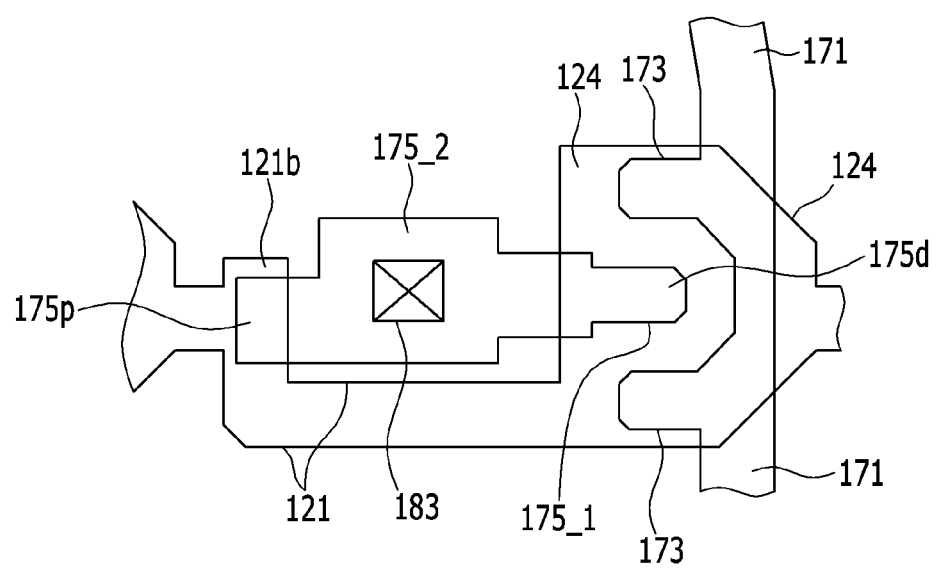
FIG. 4B is a blow up layout view of a bottom portion of FIG. 4A illustrating in detail the gate, source and drain electrodes and gate and data lines, but absent the semiconductor layer, pixel electrode according to the Comparative Example.

Turning now to FIGS. 4A and 4B, FIG. 4A is a layout view illustrating a liquid crystal display according to a Comparative Example, and FIG. 4B is a blown-up detailed view of the thin film transistor portion at the bottom of FIG. 4A. Referring now to FIGS. 4A and 4B, each data line 171 includes a source electrode 173 that extends to a gate electrode 124, the source electrode 173 including an end portion having a C shape.

A drain electrode 175 includes a first end portion 175_1 having a bar shape with a distal end 175d thereof facing the source electrode 173 at a location corresponding to the gate electrode 124. The drain electrode 175 also includes a second and opposite end portion 175_2 having a large area. The second end portion 175_2 of the drain electrode 175 having the large area also includes a protrusion 175p. The end portion of the C shape source electrode 173 may be formed in a shape surrounding a distal end portion 175d of a bar shaped first end 175_1 of the drain electrode 175.

A gate line 121 includes a plurality of gate electrodes 124, wherein each gate electrode 124 is overlapped by the source electrode 173 and the drain electrode 175. In the comparative example of FIG. 4, by forming the source electrode 173 to have a C shape, the gate electrode 124 is partially overlapped by the data line 171.

In addition, the gate line 121 has a portion 121b that is bent and overlapped by the protrusion 175p provided at the second end 175_2 of the drain electrode 175. The gate line 121 may be misaligned in a horizontal direction during a manufacturing process. If the above-mentioned misalignment occurs, parasitic capacitance Cgs between the gate electrode 124 and the source electrode 173, or between the gate electrode 124 and the drain electrode 175, may vary, thereby causing malfunction of the thin film transistor. However, by providing the protrusion 175p at the second end 175_2 of the drain electrode 175, and allowing the gate line 121 to have a portion 121b that is bent and is overlapped by the protrusion 175p at the second end 175_2 of the drain electrode 175, the variation in the parasitic capacitance Cgs caused by the misalignment of the gate line 121 may be compensated. That is, by forming the drain electrode 175 to include the protrusion 175p at the second end and allowing of the gate line 121 to have the portion 121b which is bent and overlapped by the protrusion 175p of the drain electrode 175, a non-variation structure of the parasitic capacitance Cgs results.

In the liquid crystal display according to Comparative Example of FIG. 4, as the gate electrode 124 is partially overlapped by the data line 171, the overlap between the data line 171 and the TFT channel is increased, resulting in an increase in a current magnitude of a data signal by as much as the increased overlap. This is because as the overlap between the data line 171 and the TFT channel is increased, a parasitic capacitance of the data line 171 is increased, and a greater current magnitude therefore needs to flow in the data line 171.

On the other hand, in the liquid crystal display according to the exemplary embodiment of the present invention illustrated in FIGS. 1A and 1B, by preventing the data line 171 from overlapping the gate electrode 124, the liquid crystal display according to the exemplary embodiment of the present invention consumes power less than that of the liquid crystal display according to Comparative Example of FIG. 4. For example, in a liquid crystal display of 15 inches, the parasitic capacitance of the data line 171 may be decreased by as much as approximately 5% or more, resulting in a total power consumption of the liquid crystal display being decreased by as much as approximately 0.14 W.

In addition, in the liquid crystal display according to the exemplary embodiment of the present invention illustrated in FIGS. 1A and 1B, the gate electrode 124 has the width extending from and being covered by the connecting portion 175c of the drain electrode 175 to the middle portion of the source electrode 173, thereby making it possible to compensate for the variation in the parasitic capacitance Cgs upon a horizontal misalignment of the gate line 121 during the manufacturing process. Therefore, the liquid crystal display according to the exemplary embodiment of the present invention has no need to form a separate protrusion in the drain electrode 175, and has no need to form the bent portion in the gate line 121. Therefore, a structure of the gate line 121 may be simplified, and a structural defect of the pixel in the manufacturing process may be decreased.

Meanwhile, the liquid crystal display uses wide-viewing angle technologies for allowing the screen to be better viewed, without distorting image quality at various viewing angles. An example of the wide-viewing angle technologies is a conventional twisted-nematic (TN) mode. The TN mode is a technology in which the liquid crystal molecule is aligned in a state in which it is twisted at 90°. Since the TN mode is a known technology, a detailed description thereof will be omitted. Another example of the wide-viewing angle technologies is in-plane switching (IPS). Since the development of IPS, plane-to-line switching (PLS) of FIGS. 1 and 4 has been developed as an improvement to IPS. The PLS mode is a technology for forming the electric field to be in parallel to the liquid crystal layer using a liquid crystal having horizontal alignability.

In the case in which the TFT is turned on, although voltages applied to liquid crystal capacitance Clc and sustain capacitance Cst need to be continuously kept even after the TFT is turned off, distortion in the voltage occurs due to the parasitic capacitance Cgs of the TFT. The above-mentioned distorted voltage is called as a kick back voltage. The kick back voltage may be expressed by the following Equation 1.

$$Vk = \frac{Cgs}{Clc + Cst + Cgs} \times Vd \qquad \text{[Equation 1]}$$

Here, Vk indicates the kick back voltage, Cgs indicates the parasitic capacitance of the TFT, Clc indicates the liquid crystal capacitance, Cst indicates the sustain capacitance, and Vd indicates a variation amount of a gate voltage.

Since a variation in image quality between the panels is small, as deviation of the kick back voltage is small, stabilized quality may be obtained in terms of flicker at the time of mass-production.

In an experiment of measuring the kick back voltage of the TFTs of the liquid crystal display of an existing TN mode, the liquid crystal display according to the Comparative Example of FIG. 4 and the liquid crystal display according to the exemplary embodiment of the present invention of FIG. 1 was performed. The experiment results thereof are illustrated below in Table 1.

TABLE 1

|  | TN mode (non PLS) | PLS mode according to comparative Example (FIG. 4) | PLS mode according to present invention (FIG. 1) |
| --- | --- | --- | --- |
| Cgs (pF) | 0.012 | 0.012 | 0.028 |
| Cst (pF) | 0.188 | 0.770 | 0.770 |
| Clc_white (pF) | 0.093 | 0.000 | 0.000 |
| Clc_black (pF) | 0.397 | 0.000 | 0.000 |
| Vkb_white (V) | 0.531 | 0.402 | 0.906 |
| Vkb_black (V) | 1.084 | 0.402 | 0.906 |

As can be seen from the experimental results, the PLS mode according to the Comparative Example and the PLS mode according to the exemplary embodiment of the present invention have a drawback in that these PLS modes have a sustain capacitance Cst that is larger than that of the TN mode. However, as illustrated in Table 1 above, a deviation occurs between a kick back voltage Vkb_white at the time of applying a white data voltage and a kick back voltage Vkb_black at the time of applying a black data voltage for the TN mode, while for the PLS mode according to Comparative Example and the PLS mode according to the exemplary embodiment of the present invention, there is little or no the deviation between the kick back voltage Vkb_white at the time of applying the white data voltage and the kick back voltage Vkb_black at the time of applying the black data voltage.

Hereinafter, experimental results obtained by measuring a transfer current amount, an electron concentration, a total current density, a leakage current due to light introduction, and the like of TFTs of the liquid crystal display according to the exemplary embodiment of the present invention of FIG. 1 and the liquid crystal display according to Comparative Example of FIG. 4 will be described.

Figure 5:
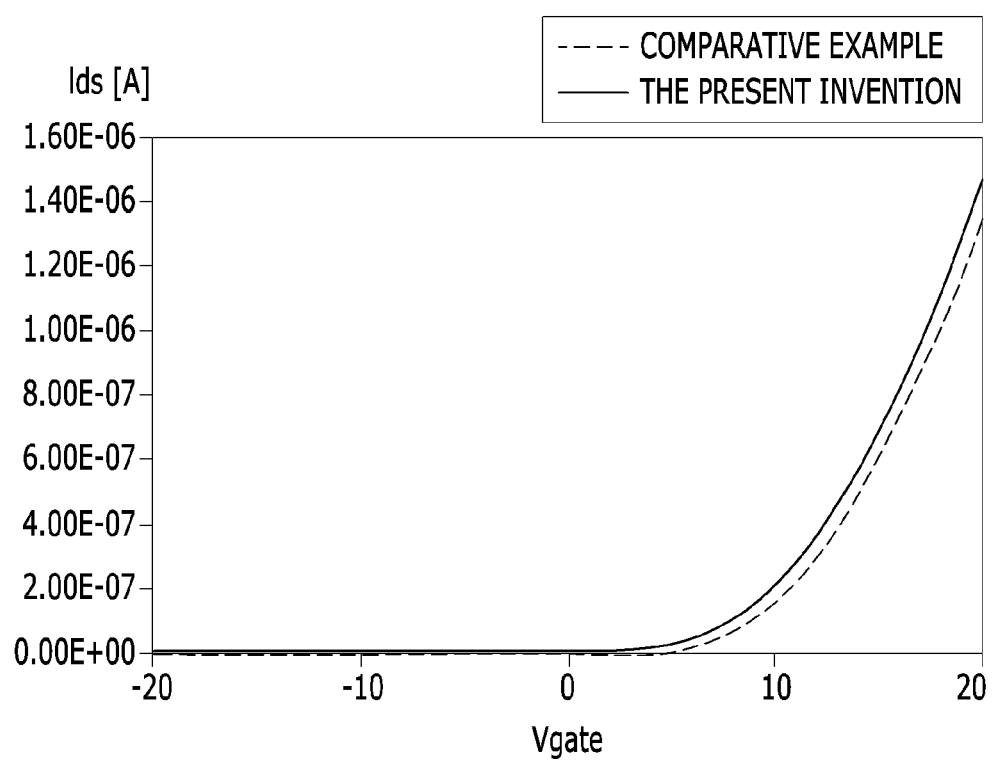
FIG. 5 is a graph illustrating experiment results obtained by measuring transfer current magnitude of TFTs of the liquid crystal display according to the first exemplary embodiment of the present invention and the liquid crystal display according to Comparative Example.

Turning now to FIG. 5, FIG. 5 is a graph illustrating experimental results obtained by measuring a transfer current amount of TFTs of the liquid crystal display according to the exemplary embodiment of the present invention and the liquid crystal display according to Comparative Example.

Referring to FIG. 5, when a gate voltage Vgate is held at a voltage of 20V, a current amount Ids flowing through the TFT of the liquid crystal display according to Comparative Example from the source electrode to the drain electrode was 1.36E-06 Amperes (i.e. $1.36 \times 10^{-6}$ Amps), and a current amount Ids flowing through the TFT of the liquid crystal display according to the exemplary embodiment of the present invention from the source electrode to the drain electrode was 1.44E-06 Amperes (i.e. $1.44 \times 10^{-6}$ Amps). That is, it can be seen that the transfer current amount of the TFT of the liquid crystal display according to the exemplary embodiment of the present invention is larger than that of the liquid crystal display according to Comparative Example as much as approximately 6%, indicating that the TFT design of the exemplary embodiment of the present invention of FIG. 1 is more efficient than that of the Comparative Example of FIG. 4.

Figure 6:
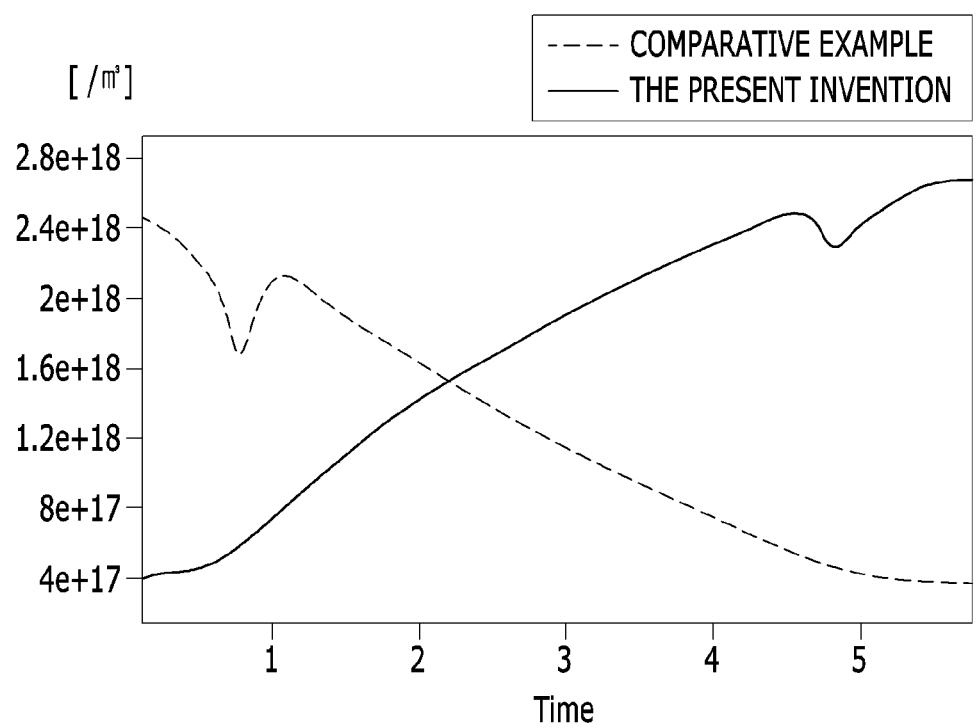
FIG. 6 is a graph illustrating experiment results obtained by measuring an electron concentration of TFTs of the liquid crystal display according to the first exemplary embodiment of the present invention and the liquid crystal display according to Comparative Example.

Turning now to FIG. 6, FIG. 6 is a graph illustrating experiment results obtained by measuring an electron concentration per cubic meter of TFTs of the liquid crystal display according to the exemplary embodiment of the present invention and the liquid crystal display according to Comparative Example. Referring now to FIG. 6, it can be seen that a channel of the TFT of the liquid crystal display according to the exemplary embodiment of the present invention generally exhibits an electron concentration that is larger than that of the liquid crystal display according to Comparative Example, again showing greater efficiency of the design of FIG. 1 over that of FIG. 4 due to the removal of the parasitic capacitance between the data line and the channel area of the semiconductor layer.

Figure 7:
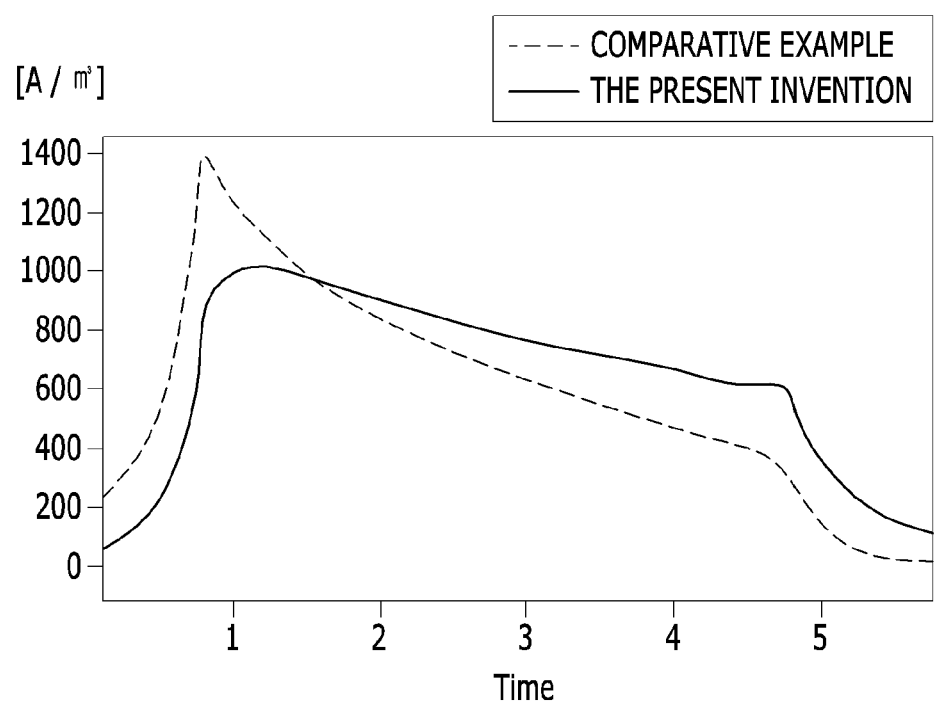
FIG. 7 is a graph illustrating experiment results obtained by measuring a total current density of TFTs of the liquid crystal display according to the first exemplary embodiment of the present invention and the liquid crystal display according to Comparative Example.

Turning now to FIG. 7, FIG. 7 is a graph illustrating experiment results obtained by measuring a total current density of TFTs of the liquid crystal display according to the exemplary embodiment of the present invention and the liquid crystal display according to Comparative Example. Referring now to FIG. 7, it can be seen that a channel of the TFT of the liquid crystal display according to the exemplary embodiment of the present invention generally exhibits a higher current density than that of the liquid crystal display according to Comparative Example.

Figure 8:
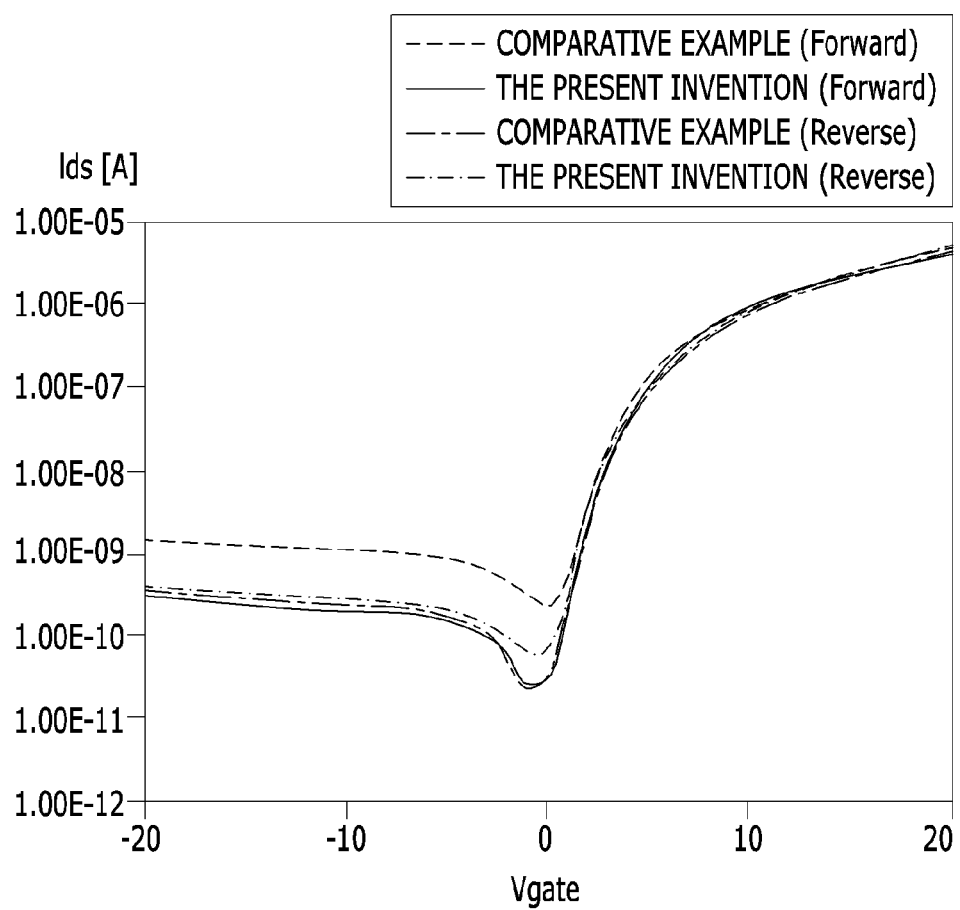
FIG. 8 is a graph illustrating experiment results obtained by measuring a leakage current due to light introduction of TFTs of the liquid crystal display according to the first exemplary embodiment of the present invention and the liquid crystal display according to Comparative Example.

Turning now to FIG. 8, FIG. 8 is a graph illustrating experiment results obtained by measuring a leakage current due to light introduction of TFTs of the liquid crystal display according to the exemplary embodiment of the present invention and the liquid crystal display according to Comparative Example.

A portion of light emitted from the light source of the backlight device is reflected by the light-shielding member 220 and is returned to the lower display panel 100. A portion of the returned light is reflected many times by the gate electrode 124 and one or both of the drain electrode 175 and the source electrode 173, and is therefore introduced into a channel region of the TFT, thereby causing the leakage current. The leakage current due to the above-mentioned light introduction decreases as a width of a light introduction path of the TFT narrows.

The light introduction path in the TFT of the liquid crystal display according to Comparative Example has two boundary portions between the gate electrode 124 and the source electrode 173, and one boundary portion between the gate electrode 124 and the drain electrode 175. The light introduction path in the TFT of the liquid crystal display according to the exemplary embodiment of the present invention has one boundary portion between the gate electrode 124 and the source electrode 173, and one boundary portion between the gate electrode 124 and the drain electrode 175. That is, the TFT of the liquid crystal display according to the exemplary embodiment of the present invention has a fewer number of light introduction paths and a smaller width than the TFT of the liquid crystal display according to Comparative Example. Therefore, the TFT of the liquid crystal display according to the exemplary embodiment of the present invention generates a smaller leakage current as illustrated in FIG. 8 than the TFT of the liquid crystal display according to Comparative Example due to fewer and smaller light introduction paths.

In practice, the leakage current due to the light introduction is significantly influenced by a light intensity that is incident on the source electrode 173 in the case of forward directional current flow in which the current flows from the source electrode 173 to the drain electrode 175, and is significantly influenced by a light amount incident on the drain electrode 175 in the case of reverse directional current flow in which the current flows from the drain electrode 175 to the source electrode 173. Since the current flows in forward and reverse directions in the TFT in the case in which the liquid crystal display is inversely driven, the leakage current due to the light introduction may vary accordingly.

Referring now to FIG. 8, it can be seen that the current Ids flowing in the TFT of the liquid crystal display according to the exemplary embodiment of the present invention in the case of both forward and reverse directions, that is, the leakage current, is smaller than the leakage current Ids flowing in the TFT of the liquid crystal display according to Comparative Example.

Table 2 shows the results obtained by measuring the leakage current in the forward and the reverse directions by applying off voltages of −7V and −13V as the gate voltage Vg.

TABLE 2

| | Current direction | Leakage current (Vg = −7 V) | Leakage current (Vg = −13 V) | Rate of leakage current (Vg = −7 V) | Rate of leakage current (Vg = −13 V) |
|---|---|---|---|---|---|
| Comparative example | forward | 9.84E−10 | 1.22E−09 | 100% | 100% |
| | reverse | 2.32E−10 | 3.02E−10 | 24% | 25% |
| Present invention | forward | 2.32E−10 | 3.02E−10 | 24% | 25% |
| | reverse | 2.02E−10 | 2.54E−10 | 21% | 21% |

In the case of the forward current direction, the leakage current of the TFT of the liquid crystal display according to Comparative Example is increased by the light amount introduced to the two light introduction paths of the source electrode 173, while in the case of the reverse current direction, the leakage current of the TFT of the liquid crystal display according to Comparative Example is slightly decreased by the light amount introduced to one light introduction path of the drain electrode 175.

Since the TFT of the liquid crystal display according to the exemplary embodiment of the present invention generates the leakage current by the light amount introduced to one light introduction path in the case of both the reverse and the forward current directions, it generates a small leakage current than the Comparative Example. It may be appreciated that the leakage current of the TFT of the liquid crystal display according to the exemplary embodiment of the present invention is a level of about 24% in the forward current direction and a level of about 21% in the reverse current direction as compared to the leakage current in the forward current direction of the TFT of the liquid crystal display according to Comparative Example.

Hereinafter, a TFT's of the exemplary embodiment of the present invention having a design structure form different from that of the TFT of the liquid crystal display described in FIGS. 1A and 1B will be described with reference to FIGS. 9 to 11. Differences from FIGS. 1A and 1B will be mainly described.

Figure 9:
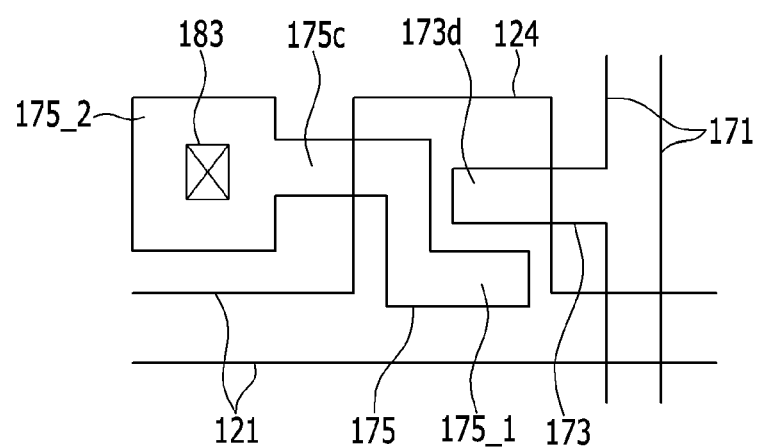
FIG. 9 is a layout view schematically illustrating a TFT of a liquid crystal display according to a second exemplary embodiment of the present invention.

Turning now to FIG. 9, FIG. 9 is a layout view schematically illustrating a TFT of a liquid crystal display according to a second exemplary embodiment of the present invention.

Referring now to FIG. 9, the TFT of the liquid crystal display includes the gate electrode 124, the source electrode 173, and the drain electrode 175.

The gate electrode 124 is attached to gate line 121, which extends in a lateral direction. The source electrode 173 is attached to the data line 171, which is extends in a longitudinal direction that intersects with the gate line 121. The source electrode 173 has a bar-shape that extends to the gate electrode 124 and includes a distal end portion 173d of the bar-shape. The source electrode 173 overlaps the gate electrode 124, while the data line 171 does not overlap the gate electrode 124.

The drain electrode 175 includes a first end portion 175_1 having an L-shape that faces the source electrode 173 at a location corresponding to the gate electrode 124 and a second and opposite end portion 175_2 having a large area. The first end portion 175_1 of the drain electrode 175 having the L-shape has two sides that face the distal end portion of the bar-shaped source electrode 173. The drain electrode 175 may also include a bar-shaped connecting portion 175c between the first and second end portions electrically connecting them together. The second end portion 175_2 of the drain electrode 175 further includes a contact hole 183 for connecting the drain electrode 175 to the pixel electrode 191.

The gate electrode 124 may have a width large enough to extend from and be overlapped by the bar-shaped connecting portion 175c of the drain electrode 175 and approximately a middle portion of the bar-shaped source electrode 173. The gate electrode 124 may also have a height corresponding to an entirety of the L-shaped first end portion 175_1 of the drain electrode 175.

The difference from the TFT of the liquid crystal display described in FIGS. 1A and 1B is that the drain electrode 175 that includes the first end portion 175_1 has an L-shape. As such, even in the case where the drain electrode 175 of the TFT of the liquid crystal display has the L-shaped first end portion, it is possible to allow only the source electrode 173 to overlap the gate electrode 124, while not having the data line 171 overlap the gate electrode 124. As a result, the overlap between the data line 171 and the TFT channel may be decreased, so that the current magnitude of the data signal applied to the data line 171 may be decreased, so that the power consumption of the liquid crystal display may be decreased. In addition, the gate electrode 124 has the width extending from the connecting portion 175c of the drain electrode 175 to the middle portion of the source electrode 173, thereby making it possible to compensate for the variation in the parasitic capacitance Cgs upon a horizontal misalignment of the gate line 121 during the manufacturing process.

Figure 10:
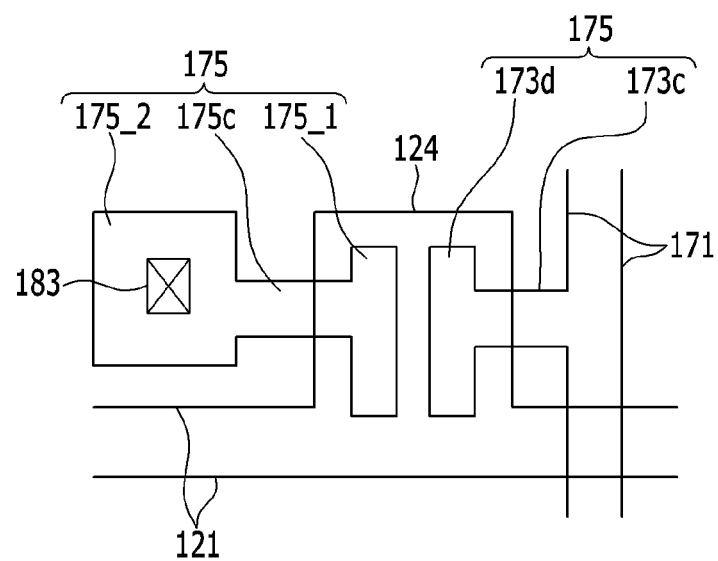
FIG. 10 is a layout view schematically illustrating a TFT of a liquid crystal display according to still a third exemplary embodiment of the present invention.

Turning now to FIG. 10, FIG. 10 is a layout view schematically illustrating a TFT of a liquid crystal display according to a third exemplary embodiment of the present invention. Referring now to FIG. 10, the gate electrode 124 is connected to the gate line 121 that extends in the lateral direction.

The source electrode 173 is connected to the data line 171 that extends in the longitudinal direction and intersects with the gate line 121. The source electrode 173 includes a distal end portion 173d having an I-shape, and a bar-shaped connecting portion 173c connecting the data line 171 to the I-shaped distal end portion 173d. The source electrode 173 overlaps the gate electrode 124, while the data line 171 does not overlap the gate electrode 124.

The drain electrode 175 includes a first end portion 175_1 having an I-shape that faces the source electrode 173 at a location that corresponds to the gate electrode 124, a second and opposite end portion 175_2 having a large area, and a connecting part 175c having a bar-shape that connects the first and second end portions together. The first end portion 175_1 of the drain electrode 175 having the I-shape may face the distal end portion of the source electrode 173.

The gate electrode 124 may have a width extending from the connecting part 175c of the drain electrode to the distal end portion 173d of the source electrode 173, and may have a height corresponding to an entirety of the first end portion 175_1 of the drain electrode 175.

The difference from the TFT of the liquid crystal display described in FIGS. 1A and 1B is that the source electrode 173 and the drain electrode 175 each include an end portion having an I-shape extending in the height direction. As a result, in the case in which the source electrode 173 and the drain electrode 175 of the TFT of the liquid crystal display each include an I-shaped end portion as in FIG. 10, it is still possible to allow the source electrode 173 to overlap the gate electrode 124, while not having the data line 171 overlap the gate electrode 124. As a result, the overlap between the data line 171 and the TFT channel may be decreased, so that the current magnitude of the data signal applied to the data line 171 may be decreased, resulting in reduced power consumption of the liquid crystal display. In addition, since the gate electrode 124 has the width capable of being covered by bar-shaped connecting portion 175c of the drain electrode 175 to the bar-shaped connecting portion 173c of the source electrode 173, it is possible to compensate for the variation in the parasitic capacitance Cgs upon a horizontal misalignment of the gate line 121 during the manufacturing process.

Figure 11:
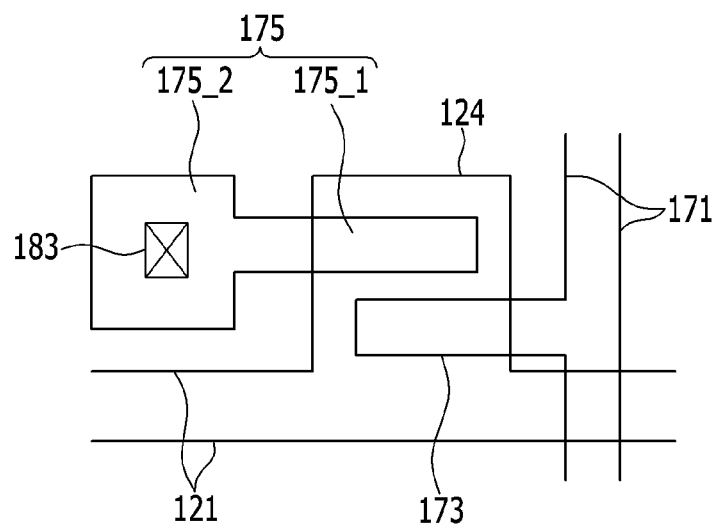
FIG. 11 is a layout view schematically illustrating a TFT of a liquid crystal display according to a fourth exemplary embodiment of the present invention.

Turning now to FIG. 11, FIG. 11 is a layout view schematically illustrating a TFT of a liquid crystal display according to a fourth exemplary embodiment of the present invention. Referring now to FIG. 11, the gate electrode 124 is connected to the gate line 121, the gate line 121 extending in the lateral direction.

The source electrode 173 is connected to the data line 171, the data line 171 extending in the longitudinal (i.e. height) direction that intersects the gate line 121. The source electrode 173 has a bar-shape that extends to the gate electrode 124. The source electrode 173 overlaps the gate electrode 124, while the data line 171 does not overlap the gate electrode 124.

The drain electrode 175 includes a first end portion 175_1 having a bar-shape that extends parallel to the bar-shaped source electrode 173 at a location that corresponds to the gate electrode 124. The drain electrode 175 has a second and opposite end portion 175_2 having a large area and a contact hole 183 that connects the drain electrode 175 to the pixel electrode. A long side of the drain electrode 175 and a long side of the source electrode 173 may be formed in a shape facing each other. The gate electrode 124 may have a width extending from and thus being overlapped by the first end portion 175_1 of the drain electrode 175 and the bar-shaped source electrode 173.

The differences between the TFT of the liquid crystal display described in FIGS. 1A and 1B and that of FIG. 11 are that the source electrode 173 and the first end portion 175_1 of the drain electrode 175 each have a bar-shape, and that the long side of the drain electrode 175 and the long side of the source electrode 173 face each other. As a result, even in the case in which the source electrode 173 and the first end portion 175_1 of the drain electrode 175 of the TFT of the liquid crystal display have a bar-shape, it is possible for the source electrode 173 to overlap the gate electrode 124, while not having the data line 171 overlap the gate electrode 124. Consequently, the overlap between the data line 171 and the TFT channel may be decreased, allowing for the current magnitude of the data signal applied to the data line 171 to be reduced, resulting in less power consumption for the liquid crystal display. In addition, the gate electrode 124 has the width extending from the bar-shaped first end portion 175_1 of the drain electrode 175 to the bar-shaped source electrode 173, thereby making it possible to compensate for the variation in the parasitic capacitance Cgs upon a horizontal misalignment of the gate line 121 during the manufacturing process.

The drawings and the detailed description of the present invention which are described above are merely illustrative, are just used for the purpose of describing the present invention, and are not used for qualifying the meaning or limiting the scope of the present invention, which is disclosed in the appended claims. Therefore, it will be appreciated to those skilled in the art that various modifications and are made and other equivalent embodiments are available. Accordingly, the actual technical protection scope of the present invention must be determined by the spirit of the appended claims.

DESCRIPTION OF SYMBOLS

3: liquid crystal layer
11: first alignment layer
21: second alignment layer
31: liquid crystal molecule
100: lower display panel
110: insulating substrate
121: gate line
124: gate electrode
124b: bent portion of gate electrode
131: common electrode
138: opening portion
140: gate insulating layer
151: semiconductor line
154: semiconductor protrusion
161: ohmic contact
163: ohmic contact
165: ohmic contact
171: data line
173: source electrode
173d: distal end portion of source electrode
173p: proximal end portion of source electrode
175: drain electrode
175_1: first end portion of drain electrode
175_2: second end portion of drain electrode
175c: connecting (i.e. neck) portion of drain electrode
175d: distal end portion of drain electrode
180x: first passivation layer
180y: second passivation layer
183: contact hole
191: pixel electrode
200: upper display panel 210: insulating substrate
220: light shielding member
230A: color filter
230B: color filter
230C: color filter
250: cover layer

What is claimed is:

1. A liquid crystal display, comprising:
a plurality of pixels to display an image, wherein each pixel includes a thin film transistor, a pixel electrode, a common electrode and a liquid crystal layer including liquid crystal molecules that have an orientation depending upon voltages applied to the pixel electrode and the common electrode;
a plurality of data lines to transfer data signals to the pixels;
a plurality of gate lines crossing the data lines to transfer gate signals to the pixels, wherein each thin film transistor comprises:
a semiconductor layer including a channel region;
a gate electrode electrically connected to one of the gate lines and being arranged at a location corresponding to the channel region;
a source electrode electrically connected to one of the data lines and partially overlapping the gate electrode, the source electrode having a bar-shape; and
a drain electrode electrically connected to the pixel electrode and facing the source electrode at a location corresponding to the gate electrode, wherein the drain electrode includes a first end portion having a C-shape that surrounds a distal end portion of the bar-shaped source electrode.

2. The liquid crystal display of claim 1, wherein the drain electrode further comprises a second and opposite end portion having a large area.

3. The liquid crystal display of claim 2, wherein the drain electrode further comprises a neck portion interposed between and connecting together the first end portion and the second end portion.

4. The liquid crystal display of claim 3, wherein the gate electrode has a width that is covered by and extends from the neck portion of the drain electrode to a middle portion of the source electrode.

5. The liquid crystal display of claim 4, wherein the gate electrode has a height that is entirely covered by the first end portion of the drain electrode.

6. The liquid crystal display of claim 1, wherein the gate electrode and the source electrode overlap each other, while the gate electrode is not overlapped by a data line.

7. The liquid crystal display of claim 1, further comprising a gate insulating layer arranged on a gate line, the semiconductor layer being arranged on the gate insulating layer, and wherein the data line and the drain electrode are arranged on the semiconductor layer.

8. The liquid crystal display of claim 1, the common electrode is arranged on a same side of the liquid crystal layer as the pixel electrode, the liquid crystal display being a plane-to-line switching mode.

9. A liquid crystal display, comprising:
a plurality of pixels to display an image, wherein each pixel includes a thin film transistor and a pixel electrode;
a plurality of data lines to transfer data signals to the pixels;
a plurality of gate lines crossing the data lines to transfer gate signals to the pixels, wherein each thin film transistor comprises:
a gate electrode electrically connected to one of the gate lines;
a source electrode electrically connected to one of the data lines and partially overlapping the gate electrode, the source electrode having a bar-shape; and
a drain electrode electrically connected to one of the pixel electrodes and facing the source electrode at a location corresponding to the gate electrode, the drain electrode including a first end portion selected from a bar shape that extends parallel to the source electrode, and an L-shape having two sides facing a distal end of the bar-shaped source electrode.

10. The liquid crystal display of claim 9, wherein the drain electrode further includes a second and opposite end portion having a large area.

11. The liquid crystal display of claim 10, wherein the first end portion is of the L-shape, the first end portion and the second end portion being connected together by a connecting portion having a bar-shape therebetween.

12. The liquid crystal display of claim 9, wherein the first end portion of the drain electrode is of the bar-shape, and wherein a long side of the drain electrode and a long side of the source electrode face each other.

13. The liquid crystal display of claim 9, wherein the source electrode overlaps the gate electrode, while the gate electrode is not overlapped by a data line.

14. A liquid crystal display, comprising:
a plurality of pixels displaying an image, each of the pixels includes a thin film transistor and a pixel electrode;
a plurality of data lines to transfer data signals to the pixels;
a plurality of gate lines crossing the data lines to transfer gate signals to the pixels, wherein each thin film transistor comprises:
a gate electrode connected to one of the gate lines;
a source electrode electrically connected to one of the data lines and partially overlapping the gate electrode, the source electrode includes a first end portion having an I-shape and a connecting portion having a bar-shape connecting a data line to the first end portion; and
a drain electrode electrically connected to one of the pixel electrodes and facing the source electrode at a location corresponding to the gate electrode, the drain electrode includes a first end portion having an I-shape that faces the source electrode.

15. The liquid crystal display of claim 14, wherein the first end portion of the drain electrode faces the first end portion of the source electrode.

16. The liquid crystal display of claim 14, wherein the drain electrode further comprises a second and opposite end portion having a large area.

17. The liquid crystal display of claim 16, wherein the drain electrode further includes a connecting portion having a bar-shape connecting the second end portion to the first end portion.

18. The liquid crystal display of claim 17, wherein the gate electrode has a width covering and extending from the connecting portion of the drain electrode to the connecting portion of the source electrode.

19. The liquid crystal display of claim 18, wherein an entirety of the first end portion of the drain electrode corresponds to and covers the gate electrode.

20. The liquid crystal display of claim 14, wherein the source electrode overlaps the gate electrode, while the data line does not overlap the gate electrode.

\* \* \* \* \*